United States Patent [19]

Iwamura

[11] Patent Number: 5,459,741
[45] Date of Patent: Oct. 17, 1995

[54] ERROR CORRECTION METHOD

[75] Inventor: Keiichi Iwamura, Kawasaki, Japan

[73] Assignee: Canon Kabushiki Kaisha, Tokyo, Japan

[21] Appl. No.: 284,289

[22] Filed: Aug. 2, 1994

Related U.S. Application Data

[63] Continuation of Ser. No. 101,828, Aug. 4, 1993, abandoned, which is a continuation of Ser. No. 625,917, Dec. 11, 1990, abandoned.

[30] Foreign Application Priority Data

Dec. 15, 1989 [JP] Japan .................................. 1-325008
Dec. 15, 1989 [JP] Japan .................................. 1-325009

[51] Int. Cl.$^6$ .................................................. G06F 11/10
[52] U.S. Cl. .......................... 371/37.1; 371/38.1; 371/53
[58] Field of Search ............................................. 371/37.1

[56] References Cited

U.S. PATENT DOCUMENTS

| | | | |
|---|---|---|---|
| 3,036,771 | 5/1962 | Fabiszewski | 371/53 |
| 3,384,902 | 5/1968 | Schroder et al. | 371/53 |
| 3,582,636 | 6/1971 | Bertram | 371/53 |
| 3,778,765 | 12/1973 | Kanter | 371/53 |
| 4,747,103 | 5/1998 | Iwamura et al. | 371/37 |

OTHER PUBLICATIONS

*Mathematics: IBM Gets Credit for Card Fail–Safe* by Malcolm Gladwell, an article which appeared in the Washington Post, date unknown.

*Primary Examiner*—Vincent P. Canney
*Attorney, Agent, or Firm*—Fitzpatrick, Cella, Harper & Scinto

[57] ABSTRACT

An error correction system includes the steps of generating a first parity by multiplying a sequentially incrementing weight by each bit of transmitting data and summing the products, generating a second parity by multiplying a sequentially incrementing weight by each bit of received data and summing the products, comparing the first parity with the second parity, detecting an error in the received data for the transmitting data based on the comparison result, and correcting the detected error based on the detection result.

4 Claims, 3 Drawing Sheets

ERROR CORRECTION METHOD

This application is a continuation of prior application Ser. No. 08/101,828 filed Aug. 4, 1993, which application is a continuation of prior application, Ser. No. 07/625,917 filed Dec. 11, 1990, both now abandoned.

BACKGROUND OF THE INVENTION

1. Field of the Invention

The present invention relates to an error correction system for detecting and correcting an error in data created in an optical disk, a magnetooptical disk or a communication path such as is used in satelite communication, by using a code, and more particularly to a detection and correction system for an error due to synchronization of data.

2. Related Background Art

Errors in digital data include an error due to the change of a bit from "0" to "1" or from "1" to "0", and an error due to the loss of a bit or insertion of a redundant bit.

In the following description, the error due to the change of a bit from "0" to "1" or from "1" to "0" is simply called an error, and a code for correcting such an error is simply called an error correction code. On the other hand, the error due to the loss of a bit or the insertion of a bit is called a synchronous error and a code for correcting such an error is called a synchronous error correction code.

Many studies have been made on error correction codes, and an excellent code for correcting a random error or a burst error has been proposed.

However, in a correction code based on the Hamming distance theory, if there is a loss of a bit or the insertion of a bit, all succeeding bits are shifted and all bits after the shift may be determined as an error. In such a case, the limit of error correction ability of the correction code is exceeded. Accordingly, effective correction is not made for a synchronous error.

In the past, the correction code has not been used for a synchronous error, but the occurrence of error has been prevented by frequent resynchronization.

A synchronous error is considered to take place when the synchronization of the clock for the data is shifted. Such an error may occur more frequently than a simple error depending on the communication system used. Frequent resynchronization can correct this but it considerably lowers the overall transmission efficiency.

SUMMARY OF THE INVENTION

It is an object of the present invention to provide an error correction system which corrects a synchronous error with a simple code.

It is another object of the present invention to provide an error correction system which corrects a synchronous error and an error due to bit inversion, with a simple code.

According to one aspect, the present invention which achieves these objectives relates to an error correction method comprising:

a step of generating a first parity by multiplying a sequentially incrementing weight to each bit of first data and summing the products;

a step of generating a second parity by multiplying a sequentially incrementing weight to each bit of second data and summing the products;

a comparison step of comparing the first parity with the second parity;

a detection step of detecting an error in the second data for the first data based on the comparison result; and a correction step of correcting the detected error based on the detection result.

According to another aspect, the present invention which achieves these objectives relates to an error correction method for correcting an error in second data for first data consisting of a plurality of symbols each consisting of a predetermined number of bits, comprising:

a step of generating a first parity by summing the bits of the first data;

a step of generating a second parity by multiplying a sequentially incrementing weight to each bit in each symbol of the first data and summing the products, and summing for all symbols;

a step of generating a third parity having the same number of bits as that of the symbol of the first data by performing an exclusive OR operation on the corresponding bits of each symbol of the first data;

a step of generating a fourth parity by summing the bits of the second data;

a step of generating a fifth parity by multiplying a sequentially incrementing weight to each bit in each symbol of the second data, summing the products, and summing for all symbols;

a first comparison step of comparing the first parity with the fourth parity;

a second comparison step of comparing the second parity with the fifth parity;

a first detection step of detecting a position of error in the second data based on the comparison results of the first and second comparison steps;

a third comparison step of performing an exclusive OR operation on the bits of the third parity and predetermined symbols based on the detection result of the first detection step;

a second detection step of detecting a correct bit pattern for the error in the second data based on the comparison result of the third comparison step; and a correction step of correcting the error based on the detection results of the first and second detection steps.

Other objectives, features and advantages, besides those discussed above, will be apparent to those skilled in the art from the description of the preferred embodiment of the invention which follows. In this description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENTS

[First Embodiment]

A code for correcting a one-bit synchronous error is described below. The synchronous error may be caused by the loss of a bit or the insertion of a bit. The loss of a bit is first discussed.

A k-bit information sequence I is represented by $[I_k, I_{k-1}, \ldots, I_1]$. In a transmitting station, the following parity $P_1$ which is a product of each bit $I_i$ of the information sequence and a weight i is added before the transmission.

$$P_1 = \sum_{i=1}^{k} I_i \cdot i \tag{1}$$

If a bit $I_j$ is lost during the transmission (loss of bit), a receiving station receives the following (k−1)bit information sequence I' and the parity $P_1$ shown in the formula (1).

$$I'=[I_k, I_{k-1}, \ldots, I_{j+1}, I_{j-1}, \ldots, I_2, I_1]$$

Parity $Q_1$ is calculated based on I' by multiplying k, k−1, ..., 2, to the (k−1) bits, $I_k, I_{k-1}, \ldots, I_{j+1}, I_{j-1}, \ldots, I_2, I_1$, in the same manner as the parity $P_1$. At and after $I_{j-1}$, weights which are one larger than suffixes are multiplied. Thus, $$Q_1 = \sum_{i=j+1}^{k} I_i \cdot i + \sum_{i=1}^{j-1} I_i \cdot (i+1) \tag{2}$$

From the formulas (1) and (2), $$P_1 - Q_1 = I_j \cdot j - \sum_{i=1}^{j-1} I_i \tag{3}$$

If the lost bit $I_j$ is "0", $$P_1 - Q_1 = -\sum_{i=1}^{j-1} I_i \leq 0,$$

and if $I_j$ is "1", $$\sum_{i=1}^{j-1} I_i \leq j-1$$

and hence $P_1-Q_1>0$.

Accordingly, the value of the lost bit $I_j$ can be determined by the sign of $P_1-Q_1$.

When $$P_1 - Q_1 \leq 0 (I_j = \text{``0''}), |P_1 - Q_1| = \sum_{i=1}^{j-1} I_i$$

indicate the total number of "1" bits between $I_1$ and $I_{j-1}$ at which the bit shift starts. Thus, it is seen that the bit shift due to the loss of bit $I_j$="0" starts from the $|P_1-Q_1|$th "1" bit as counted from $I_1$. Thus, "0" is inserted to the left of the $|P_1-Q_1|$th "1" bit to correct the lost bit $I_j$.

On the other hand, when $$P_1 - Q_1 > 0, P_1 - Q_1 - 1 = j - 1 - \sum_{i=1}^{j-1} I_i$$

indicates the total number of bit-shifted "0" bits between $I_1$ and $I_{j-1}$ (because the total number j−1 of the bit-shifted bits less the total number of "1" bits $$\sum_{i=1}^{j-1} I_i$$

is equal to the total number of "0" bits).

Thus, "1" is inserted to the left of the $(P_1-Q_1-1)$th "0" bit to correct the lost bit $I_j$="1".

The insertion of "1" bit is now considered.

It is assumed that the transmission station transmits the above-mentioned (k−1)bit $I'=[I_k, I_{k-1}, \ldots, I_{j-1}, \ldots, I_2, I_1]$ and the following $P_1$ for the parity thereof.

$$P_1 = \sum_{i=j+1}^{k} I_i \cdot (i-1) + \sum_{i=1}^{j-1} I_i \cdot i \tag{4}$$

If $I_j$ is inserted during the transmission of the above information sequence, the receiving station receives $$I=[I_k, I_{k-1}, \ldots, I_{j+1}, I_j, I_{j-1}, \ldots, I_2, I_1].$$

Thus, $Q_1$ and $Q_1-P_1$ are represented by $$Q_1 = \sum_{i=1}^{k} I_i \cdot (i-1) \tag{5}$$

$$Q_1 - P_1 = I_j \cdot (j-1) - \sum_{i=1}^{j-1} I_i \tag{6}$$

In the formula (6), if $I_j$="0", $$Q_1 - P_1 = -\sum_{i=1}^{j-1} I_i \leq 0, \text{ and}$$

if $I_j$="1", $$Q_1 - P_1 = j - 1 - \sum_{i=1}^{j-1} I_i \geq 0.$$

Accordingly, if $Q_1-P_1<0$, $I_j$="0", and if $Q_1-P_1<0$, $I_j$="1".

Thus, the position of error is detected by the same theory as that for the formula (3) and the bit is deleted to correct the error due to the insertion of bit.

When $Q_1-P_1=0$ and if $$I_j = \text{``0''}, -\sum_{i=1}^{j-1} I_i = 0$$

and hence $I_{j-1}=\ldots=I_1$="0".

When $Q_1-P_1=0$ and if $$I_j = \text{``1''}, \sum_{i=1}^{j-1} I_i = j - 1$$

and hence $I_{j-1}=\ldots=I_1$="1".

In any case, since $I_j=\ldots=I_1$, the least significant bit may be deleted.

In this manner, the error due to one bit insertion is corrected.

It is now assumed that a one bit simple error rather than a synchronous error has occurred.

In the transmission station, the information sequence I and the parity $P_1$ shown in the formula (1) are transmitted, and during the transmission, an error $e_j$ is added to the bit $I_j$ so that it changes to $I_j+e_j$.($e_j$ is −1 when $I_j$="1", and 1 when $I_j$="0".)

$Q_1$ and $Q_1-P_1$ are represented by $$Q_1 = \sum_{i=1}^{k} I_j \cdot i + e_j \cdot j \quad (7)$$

$$Q_1 - P_1 = e_j \cdot j \quad (8)$$

Since $e_j$ is either 1 or −1, the value of $e_j$ can be determined by the sign of $Q_1 P_1$ in the formula (8), and the position of error j is determined by $j=|Q_1-P_1|$. Thus, it is corrected.

In this manner, one bit simple error is corrected.

By using the parity $P_1$ of the present invention which is generated by multiplying the bit $I_i$ in the information sequence shown in the formula (1) with the weight i, the one bit synchronous error due to the loss of a bit or the insertion of a bit and a one bit simple error can be corrected.

An implementation method of the present embodiment by a circuit is now described.

Figure 1:
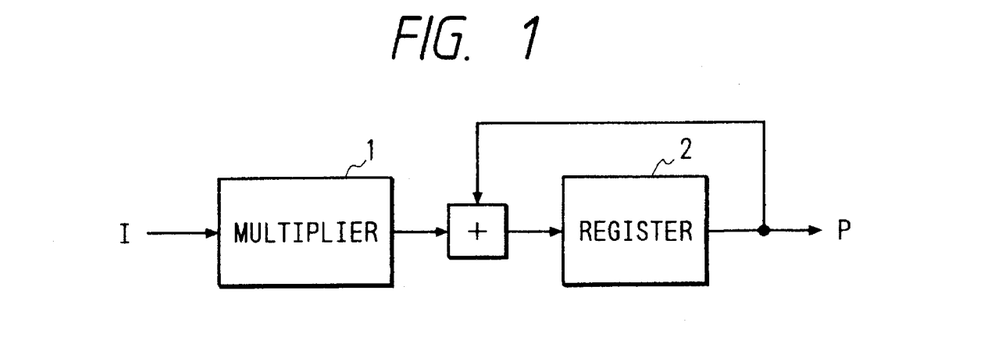
FIG. 1 shows a block diagram of an encoder in an embodiment of the present invention.

FIG. 1 shows an encoder used in a transmission station in the present embodiment.

Each bit $I_i$ of the information sequence I is multiplied by the weight i by a multipler 1 and the product is added to the content of a register 2 to generate the parity $P_1$. The weight i is incremented by a counter in the multiplier.

The generated parity $P_1$ and the information sequence I are transmitted by a transmitter (not shown).

Figure 2:
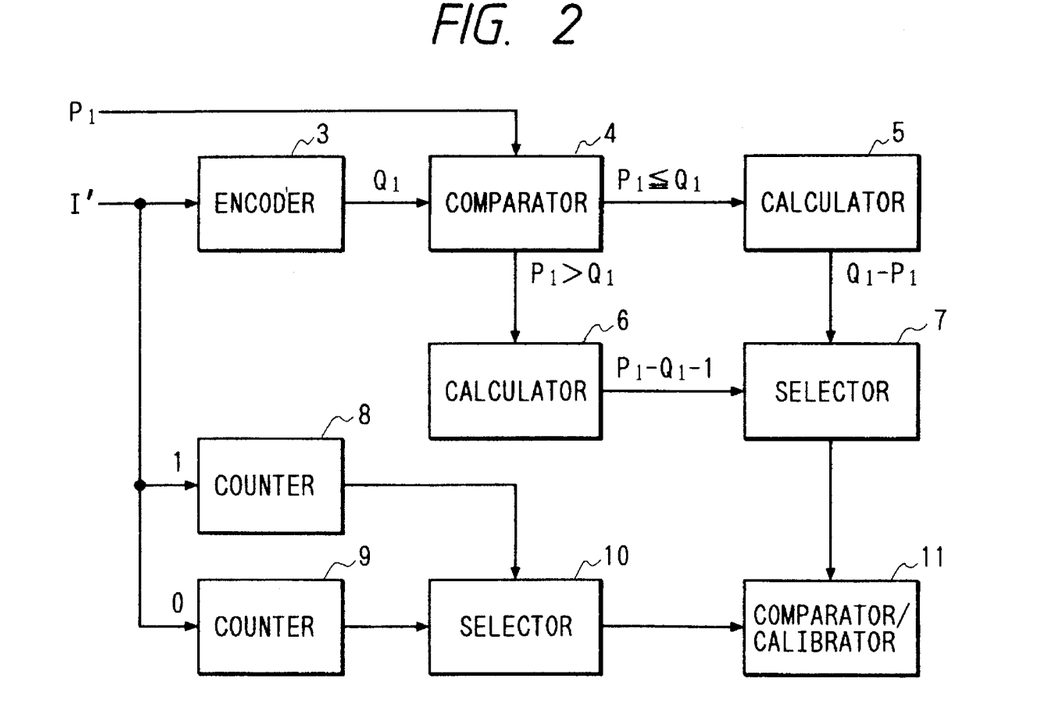
FIG. 2 shows a block diagram of a decoder in an embodiment of the present invention.

FIG. 2 shows a configuration of a decoder in a receiving station which is used for the one bit loss.

When the information sequence I transmitted by the transmitter has one bit lost during the transmission and changes to I', the information sequence I' and the parity $P_1$ are received by a receiver (not shown) and the parity $Q_1$ is generated by an encoder 3. The encoder 3 is configured in the same manner as that of FIG. 1 used in the transmitter.

A comparator 4 compares the parity $Q_1$ generated by the encoder 3 with the received parity $P_1$. In accordance with the theory of the formula (3), if $P_1 \leq Q_1$, a calculator 5 calculates $Q_1-P_1$ and a selector 7 selects the result. A counter 8 counts the number of "1" bits and a selector 10 selects the result. The contents of the selectors 7 and 10 are compared by a comparator/calibrator 11, and a "0" bit is inserted to the left of the $(Q_1-P_1)$th "1" bit to correct to the one bit loss.

When $P_1>Q_1$, a calculator 6 and a counter 9 are used to correct the one bit loss in the same manner.

For the bit insertion error, the parities $P_1$ and $Q_1$ are generated by the encoders of the same configuration as that described above and they are compared by the comparator. If the difference $P_1-Q_1$ is zero, the least significant bit is deleted by the calibrator. If the difference is positive or negative, the position of the bit to be deleted is determined by the independent calculator, counter and comparator/calibrator in the same manner as that for the lost bit, and it is deleted.

When a one bit simple error occurs, the parities are generated by the encoders, the parities are compared by the comparator to determine the value of the added error bit, and the absolute value of the difference is calculated by the calculator so that the position of the error is determined and the error bit is corrected by the calibrator.

In the code used in the present invention, since $k \geq P_1-Q_1 \geq -k+1$, $P_1$ and $Q_1$ may be multiples of 2 k. In this case, $P_1-Q_1$ which meets a condition $2 k-1 \geq P_1-Q_1 \geq k+1$ assumes a negative value which is given by $P_1-Q_1-2 k$. Thereafter, the position of error can be determined by the procedure shown herein.

Accordingly, the number of bits required for $P_1$ is equal to $\log_2 2k$, and the synchronous error can be efficiently prevented with a sufficiently smaller redundancy than that of the resynchronization.

[Second Embodiment]

A code for correcting a one bit synchronous error is described below. The synchronous errors include the loss of a bit and the insertion of a bit. The loss of a bit is first explained.

A k-symbol information sequence I is represented by $[I_k, I_{k-1}, \ldots, I_2, I_1]$, where $I_i$ is a q-bit symbol as shown below.

$$[I_i = I_{i,q}, I_{i,q-1}, \ldots, I_{i,2}, I_{i,1}]$$

The transmission station generates the following parities $P_0$, $P_1$ and $R_1$ based on the information sequence I, adds them to I, and sends them.

$$P_0 = \sum_{i=1}^{k} \left( \sum_{h=1}^{q} I_{i,h} \right) \quad (1)$$

$$P_1 = \sum_{i=1}^{k} \left( \sum_{h=1}^{q} I_{i,h} \cdot i \right) \quad (2)$$

$$R_1 = EXOR \sum_{i=1}^{k} I_i \quad (3)$$

where EXOR $\Sigma$ indicates an exclusive OR of the bits of the same position in the q-bit symbol $I_i$. If a bit $I_{j,p}$ in a symbol $I_j$ is lost during the transmission and error $e_{j,h}$ is added to each of the other bits $I_{j,h}$, each of the bits of the symbol $I_j$ excluding $I_{j,p}$ is represented by $I_{j,h}+e_{j,hd}$ (where $e_{j,h}$ is 1 when $I_{j,h}$ changes from "0" to "1", it is −1 when $I_{j,h}$ changes from "1" to "0", and it is 0 when there is no error). Based on the received data, $P_0$ and $P_1$ are generated, and $Q_0$ and $Q_1$ are also generated in a similar procedure as shown below.

$$Q_0 = P_0 - I_{j,p} + \sum_{h=1}^{q} e_{j,h} \quad (4)$$

$$Q_1 = P_1 - I_{j,p} \cdot j + \sum_{h=1}^{q} e_{j,h} \cdot j + \sum_{i=1}^{j-1} I_{i,q} \quad (5)$$

Thus, $P_0-Q_0$ and $P_1-Q_1$ are represented as follows.

$$P_0 - Q_0 = I_{j,p} - \sum_{h=1}^{q} e_{j,h} \quad (6)$$

$$P_1 - Q_1 = \left( I_{j,p} - \sum_{h=1}^{q} e_{j,h} \right) \cdot j + \sum_{i=1}^{j-1} I_{i,q} \quad (7)$$

$$= (P_0 - Q_0) \cdot j - \sum_{i=1}^{j-1} I_{i,q}$$

In the formula (7), unknown factors are j and $$\sum_{i=1}^{j-1} I_{i,q}.$$

When $P_0-Q_0 \leq 0$, x represents j and y represents $$\sum_{i=1}^{x-1} I_{i,q}$$

which is a total sum of the shifts of "1" bits for each symbol when i changes from 1 to x−1, then the relation between x and y is derived from the formula (7) as follows.

$$Y = (Q_0-P_0)x-(P_1-Q_1) \quad (8)$$

Figure 5:
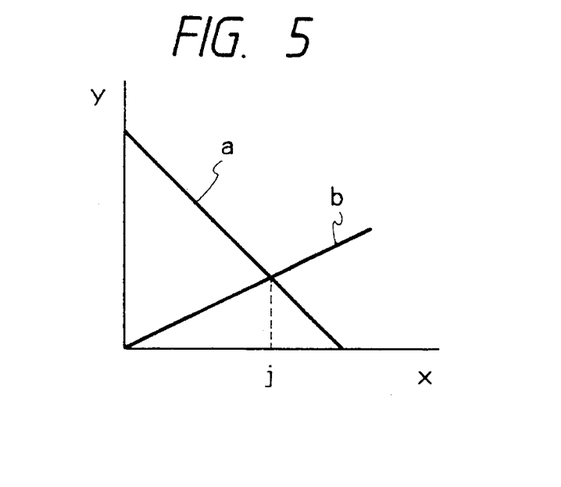
FIG. 5 shows a graph of a relation of codes.

When $P_0-Q_0 \leq 0$, $P_1-Q_1 \leq 0$ as seen from the formula (7). Thus, the formula (8) is represented by a line a shown in FIG. 5 in which y has a positive value $Q_1-P_1$ when x=0 and changes with x with a negative gradient. On the other hand, the relation between x, which represents an actual symbol position and y, which represents a total sum of the shifts of "1" bits, is represented by a line b shown in FIG. 5 in which y=0 when x=0 and y monotonously increases with x. Accordingly, the lines a and b always have one crosspoint. Since j is to simultaneously satisfy the line a which represents the formula (7) and the line b which represents the actual shift, the value of x at the crosspoint of the lines a and b is j.

When $P_0-Q_0>0$, x represents j and y represents $$(x-1) - \sum_{i=1}^{x-1} I_{i,q}$$

which is a total sum of the shifts of "0" bits for each symbol when i changes from 1 to x−1, then the formula (7) is represented by $$Y=-(P_0-Q_0-1)x+(P_1-Q_1 1-) \quad (9)$$

When $P_0-Q_0>0$, $P_1-Q_1>1>0$ as seen from the formula (7). Thus, the formula (9) is represented by the line a shown in FIG. 5 in which y has a positive value $P_1-Q_1-1$ when x=0 and changes with x with a negative gradient $-(P_0-Q_0-1)$, like the formula (8).

A relation between x, which represents the actual symbol position, and y, which represents the total sum of shifts of "0" bits, is represented by the line b shown in FIG. 3 in which y=0 when x=0 and y monotonously increases with x. Accordingly, the same theory as that when $P_0-Q_0 \leq 0$ is applicable, and the value of x at the crosspoint of the lines a and b is j.

In this manner, the position j of the synchronous error including the error can be determined. The error pattern can be directly identified by restoring the shift of the symbol after j at which the shift has started, identifying the symbols other than $I_j$, and exclusive -ORing $R_1$ with the symbols other than $I_j$.

The bit insertion error is opposite to the bit loss error. Accordingly, the synchronous error including the error may be corrected in a similar process.

While a one-bit synchronous error has been discussed above, the present code can correct the synchronous error of random S bits in one symbol in the same procedure as that described above.

A simple example is shown below.

The following information sequence I and parities $P_0$, $P_1$, $R_1$, with q=3 and k=5 are transmitted.

I [111101000100100]

$P_0=7$ $P_1=5.3+4.2+3.0+2.1+1.1=26$ $R_1=010$

If a synchronous error including an error occurs in a symbol $I_3=[000]$ at j=3 during the transmission so that $I_3$ changes to [11], the received information sequence I', and $Q_0$ and $Q_1$ calculated based on I' are:

I'=[11110111100100]

$Q_0=9$ $Q_1=5.3+4.2+3.3+2.1+1.0=34$

Accordingly, $P_0-Q_0$, $P_1-Q_1$ are represented by $P_0-Q_0=7-9=-2$ $P_1-Q_1=26-34=-8$ Since $P_0-Q_0 \leq 0$, from the formula (8), $Y=(P_0-Q_0)x-(P_1-Q_1)=-2x+8$ It is compared with $$y' = \sum_{i=1}^{x-1} I_{i,q}.$$

Both y and y' are equal to 2 when x=3. Since there exists only one x value at which y and y' coincide, j=3 is determined, and the shifts of the subsequent symbols $I_2$ and $I_1$ are restored, the symbols other than $I_3$ are restored, and the symbols other than $I_3$ are determined as follows.

[111101???100100 ]

By exclusively ORing $R_1$ with the symbols other than $I_3$, $I_3$=[000] is obtained. In this manner, the synchronous error including the error is corrected.

A method for implementing the present invention by an actual circuit is now explained.

Figure 3A:
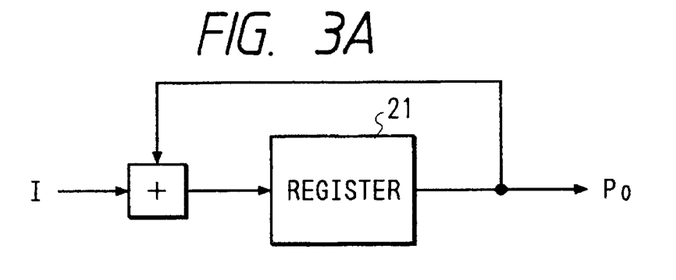
FIGS. 3A to 3C show block diagrams of an encoder in an embodiment of the present invention
Figure 3B:
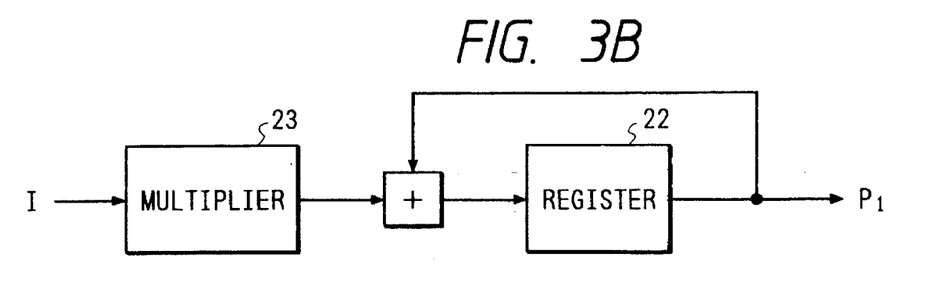
Figure 3C:
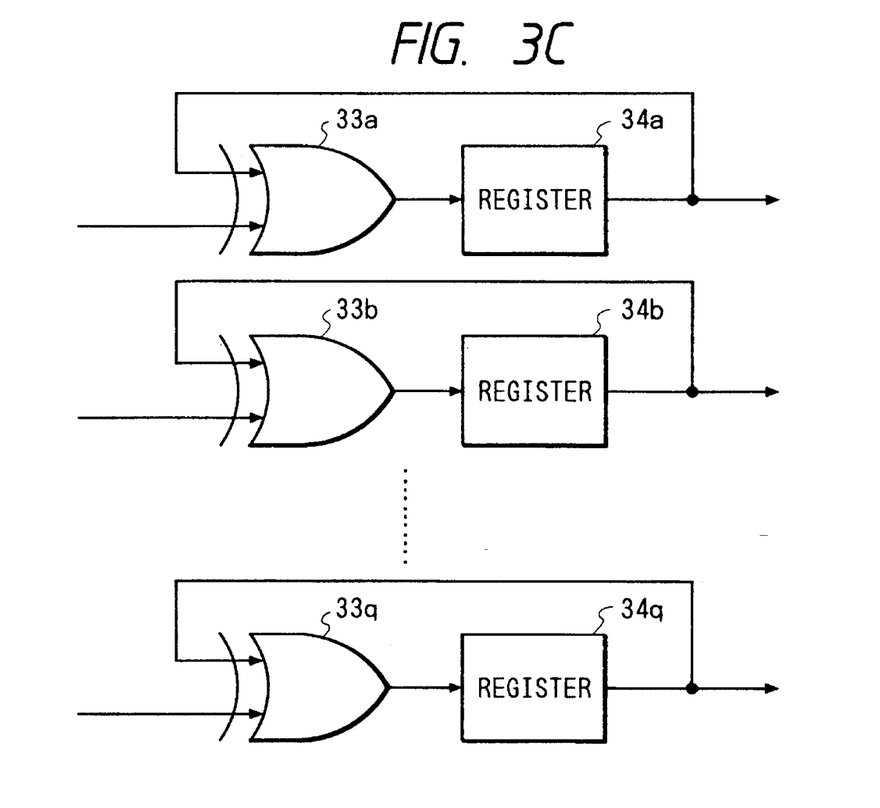

FIGS. 3A to 3C show configurations of encoders used in the transmission station.

In FIG. 3A, each bit $I_{i,h}$ of each symbol $I_i$ of the information sequence I is sequentially added to the content of a register 21, and a sum is stored in the register 21 to generate the parity $P_0$.

In FIG. 3B, each bit $I_{i,h}$ of each symbol $I_i$ of the information sequence I is multiplied by a weight i by a multiplier 23, and a product is sequentially added to the content of a register 22 to generate the parity $P_1$. The weight i is incremented for each symbol by a counter in the multiplier.

In FIG. 3C, each q-bit symbol is applied to q EXOR circuits 33a to 33q parallel by symbol, they are EXORed with registers 34a to 34q, respectively, and the results are stored in the registers 34a to 34q to generate the q-bit parity $R_1$.

The generated parities $P_0$, $P_1$ and $R_1$ are transmitted by a transmitter (not shown) together with the information sequence I.

Figure 4:
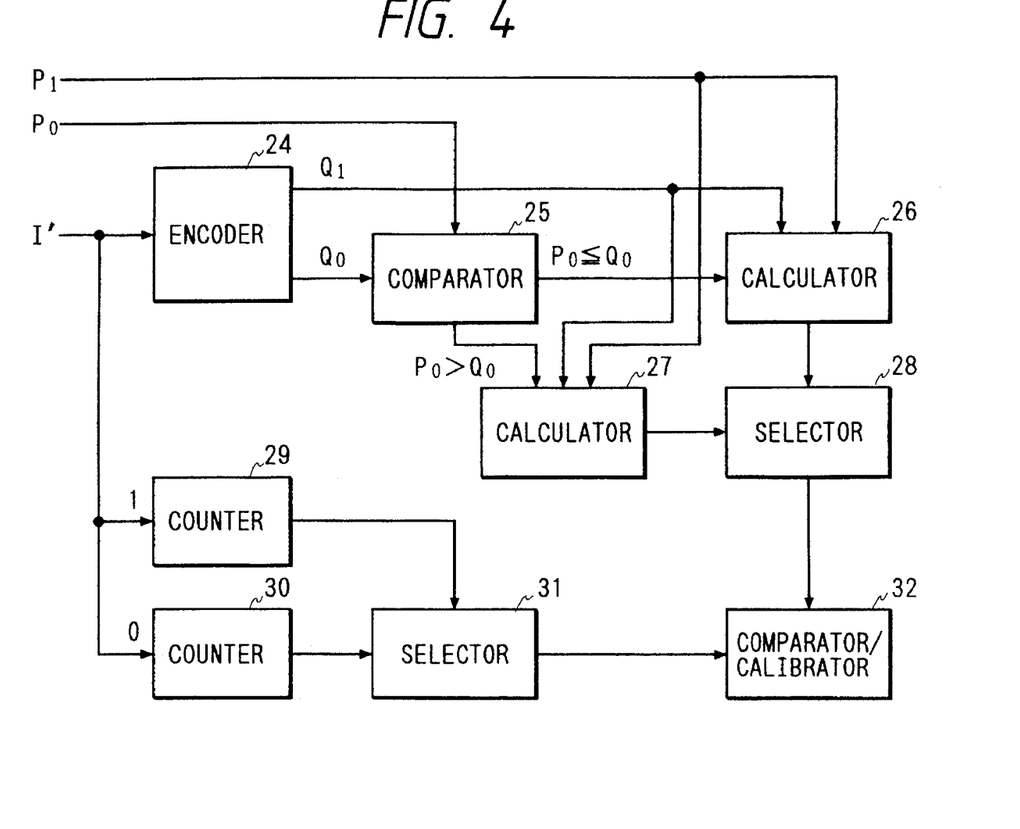
FIG. 4 shows a block diagram of a decoder an embodiment of the present invention.

FIG. 4 shows a configuration of a decoder in a receiving station for correcting the one-bit loss error.

If the information sequence I transmitted by the transmitter changes to I' because of one bit loss during the transmission, the receiving station which receives the information sequence I' as well as the parities $P_0$ and $P_1$ by a receiver (not shown) generates the parities $Q_0$ and $Q_1$ by an encoder 24. The encoder 24 has the same configuration as that of the transmission station shown in FIGS. 3A and 3B.

A comparator 25 compares the parity $Q_0$ generated by the encoder 24 with the received parity $P_0$. In accordance with the theory of the formulas (7) to (9), if $P_0 \leq Q_0$, $y=(P_0-Q_0)x-(P_1-Q_1)$ is calculated and the result is selected by a selector 28. On the other hand, a counter 29 counts the number of "1" bits, a selector 31 selects the count, a comparator/calibrator 32 compares the contents of the selectors 28 and 31, and the value of x when the contents coincide is selected as j.

In this manner, the portion j of the synchronous error including the error is determined. The shifts of symbols after the position j are restored and the symbols other than $I_j$ are determined. The correct bit pattern of $I_j$ can be directly determined by calculating the exclusive OR of $R_1$ and the symbols other then $I_j$ in the same manner as that of encoding of $R_1$.

In the code used in the present invention, the number of bits required for $P_0$ is $\log_2 2q$ because $q \leq P_0 - Q_0 \leq -q$. The number of bits required for $P_1$ and $R_1$ are $\log_2 sk$ and $q$, respectively.

For example, when $q=8$ and $k=253$, the total number of parity bits required is 20 because 4 bits are required for $P_0$ and 8 bits are required for $P_1$ and $R_1$, respectively, when only the one-bit synchronous error (S=1) is to be corrected. This is compared with a Reed Solomon code which is a least redundancy code in a linear error correction code. For the one-symbol correction, the Reed Solomon code requires 16 bits and the difference is only 4 bits. Considering the fact that the code of the present invention is not a mere error correction code but it can correct the synchronous error, the redundancy is sufficiently small and the present code can efficiently prevent the synchronous error.

What is claimed is:

1. A data transmission system in which data is transmitted from a first site in said system to a second site in said system, said system comprising in the first site:
   an encoder for generating a first parity by multiplying a sequentially one by one decreasing weight by each bit of data to be transmitted and summing the products;
   a transmitter for transmitting the data and the first parity thereof to the second site,
   said system comprising in the second site:
   a receiver for receiving the data and the first parity thereof transmitted from the first site;
   a decoder for reproducing the transmitted data by correcting an error in received data caused by a one-bit loss from the transmitted data,
   said decoder comprising:
      generating means for generating a second parity by multiplying a sequentially one by one decreasing weight by each bit of the received data and summing the products;
      subtraction means for subtracting the second parity from the received first parity;
      value determination means for determining a value of a lost bit by discriminating the sign of the result of the subtraction by said subtraction means;
      position determination means for determining a start position of an error in the received data in accordance with the value of the lost bit determined by said value determination means and a value of the result of the subtraction; and
      inserting means following inserting a bit of the value determined by said value determination means at the start position of the error determined by said position determination means in the received data.

2. A data transmission system in which data is transmitted from a first site in said system to a second site in said system, said system comprising in the first site:
   an encoder for generating a first parity by multiplying a sequentially one by one decreasing weight by each bit of data to be transmitted and summing the products;
   a transmitter for transmitting the data and the first parity thereof to the second site,
   said system comprising in the second site:
   a receiver for receiving the data and the first parity thereof transmitted from the first site;
   a decoder for reproducing transmitted data by correcting an error in received data caused by a one-bit insertion from the transmitted data,
   said decoder comprising:
      generating means for generating a second parity by multiplying a sequentially one by one decreasing weight by each bit of the received data and summing the products;
      subtraction means for subtracting the second parity from the received first parity;
      value determination means for determining a value of an inserted bit by discriminating the sign of the result of the subtraction by said subtraction means;
      position determination means for determining a start position of an error in the received data in accordance with the value of the inserted bit determined by said value determination means and a value of the result of the subtraction; and
      deleting means for deleting a bit at the start position of the error determined by said position determination means in the received data.

3. A data transmission system in which data is transmitted from a first site in said system to a second site in said system, said system comprising in the first site:
   an encoder for generating a first, a second, and a third parity for data to be transmitted;
   a transmitter for transmitting the data and the first, the second, and the third parity thereof to the second site,
   said encoder comprising:
      first generating means for generating the first parity by summing all bits of data to be transmitted;
      second generating mans for generating the second parity by multiplying a sequentially one by one decreasing weight by each bit in each symbol of the data to be transmitted and summing the products, and summing for all symbols;
      third generating means for generating a third parity having the same number of bits as that of the symbol of the data by performing an exclusive OR operation on the corresponding bits of each symbol of the data, respectively,
   said system comprising in the second site:
      a receiver for receiving the data and the first, the second, and the third parity thereof transmitted from the first site;
      a decoder for reproducing transmitted data by correcting an error in received data comprising a plurality of symbols each comprising a predetermined number of bits, caused by a one-bit loss from the transmitted data,
      said decoder comprising:
         fourth generating means for generating a fourth parity by summing all of the bits of the received data;
         fifth generating means for generating a fifth parity by multiplying a sequentially one by one decreasing weight by each bit in each symbol of the received data, summing the products, and summing for all symbols;
         first subtraction means for subtracting the fourth parity from the received first parity;
         second subtraction means for subtracting the fifth parity from the received second parity;
         obtaining means for obtaining a first condition to be satisfied by the location of a symbol containing an error based on both of the results of subtractions by said first and second subtraction means;
         discriminating means for successively discriminating whether the location of each symbol satisfies the first condition under a second condition to be satisfied by the location of the symbol containing error;

location determination means for determining the location discriminated to satisfy the first condition under the second condition as the location of the symbol containing error;

pattern discrimination means for determining a correct bit pattern of the symbol containing error by an exclusive OR operation on the third parity and the corresponding bits of each symbol of the received data except for the symbol in the location determined as that of the symbol containing error, respectively;

shifting means for shifting backward the symbols succeeding to the symbol in the determined location by one bit; and pattern correction means for correcting the bit pattern of the symbol in the determined location by using the determined correct bit pattern.

4. A data transmission system in which data is transmitted from a first site in said system to a second site in said system, said system comprising in the first site:

an encoder for generating a first, a second, and a third parity for data to be transmitted;

a transmitter for transmitting the data and the first, the second, and the third parity thereof to the second site, said encoder comprising:

first generating means for generating the first parity by summing all bits of data to be transmitted;

second generating means for generating the second parity by multiplying a sequentially one by one decreasing weight by each bit in each symbol of the data to be transmitted and summing the products, and summing for all symbols;

third generating means for generating a third parity having the same number of bits as that of the symbol of the data by performing an exclusive OR operation on the corresponding bits of each symbol of the data, respectively, said system comprising in the second site:

a receiver for receiving the data and the first, the second, and the third parity thereof transmitted from the first site;

a decoder for reproducing transmitted data by correcting an error in received data comprising a plurality of symbols each comprising a predetermined number of bits, caused by a one-bit insertion from the transmitted data, said decoder comprising:

fourth generating means for generating a fourth parity by summing all the bits of the received data;

fifth generating means for generating a fifth parity by multiplying a sequentially one by one decreasing weight by each bit in each symbol of the received data, summing the products, and summing for all symbols;

first subtraction means for subtracting the fourth parity from the received first parity;

second subtraction means for subtracting the fifth parity from the received second parity;

obtaining means for obtaining a first condition to be satisfied by the location of a symbol containing error based on both of the results of subtractions by said first and second subtraction means;

discriminating means for successively discriminating whether the location of each symbol satisfies the first condition under a second condition to be satisfied by the location of the symbol containing error;

location determination means for determining the location discriminated to satisfy the first condition under the second condition as the location of the symbol containing error;

pattern determination means for determining a correct bit pattern of the symbol containing error by performing an exclusive OR operation on the third parity and the corresponding bits of each symbol of the received data except for the symbol in the location determined as that of the symbol containing error, respectively;

shifting means for shifting forward the symbols succeeding to the symbol in the determined location by one bit; and pattern correction means for correcting the bit pattern of the symbol in the determined location by using the determined correct bit pattern.

* * * * *

UNITED STATES PATENT AND TRADEMARK OFFICE
CERTIFICATE OF CORRECTION

PATENT NO. : 5,459,741  
DATED : October 17, 1995  
INVENTOR(S) : Keiichi IWAMURA Page 1 of 2

It is certified that error appears in the above-indentified patent and that said Letters Patent is hereby corrected as shown below:

ON THE COVER PAGE:

Under "U.S. PATENT DOCUMENTS":

"4,747,103 5/1998 Iwamura et al." should read --4,747,103 5/1988 Iwamura et al.--.

COLUMN 1:

Line 14, "satelite" should read --satellite--.

COLUMN 4:

Line 11, "$I'=[I_k, I_{k-1}, \ldots, I_{j-1}, \ldots, I_2, I_1]$" should read --$I'=[I_k, I_{k-1}, \ldots, I_{j+1}, I_{j-1}, \ldots, I_2, I_1]$--; and Line 40, "$I_j$-"0"," should read --$I_j$="0",--.

COLUMN 5:

Line 8, "$Q_1\ P_1$" should read --$Q_1$-$P_1$--.

COLUMN 6:

Line 25, "$I_{j,h}+e_{j,hd}$" should read --$I_{j,h}+e_{j,h}$--.

UNITED STATES PATENT AND TRADEMARK OFFICE
CERTIFICATE OF CORRECTION

PATENT NO. : 5,459,741
DATED : October 17, 1995
INVENTOR(S) : Keiichi IWAMURA

It is certified that error appears in the above-indentified patent and that said Letters Patent is hereby corrected as shown below:

<u>COLUMN 7</u>:

Line 18, "$\underline{Y}=-(P_0-Q_0-1)x+(P_1-Q_1 1-)$" should read --$Y=-(P_0-Q_0-1)x+(P_1-Q_1-1)$--; and Line 19, "$P_0-Q_0>0, P_1-Q_1>1>0$" should read --$P_0-Q_0>0, P_1-Q_1-1>0$--.

<u>COLUMN 8</u>:

Line 55, "$y=(P_{0-Q0})x-$" should read --$y=(P_0-Q_0)x-$--.

<u>COLUMN 9</u>:

Line 2, "$q \leq P_0-Q_0 \leq -q.$" should read --$q \geq P_0-Q_0 \geq -q.$--.

<u>COLUMN 10</u>:

Line 27, "mans" should read --means--.

Signed and Sealed this

Twenty-first Day of May, 1996

Attest:

BRUCE LEHMAN

*Attesting Officer*      *Commissioner of Patents and Trademarks*